United States Patent [19]

Onyszchuk et al.

[11] Patent Number: 4,745,568
[45] Date of Patent: May 17, 1988

[54] COMPUTATIONAL METHOD AND APPARATUS FOR FINITE FIELD MULTIPLICATION

[76] Inventors: Ivan M. Onyszchuk, 62 Dorset St. #5; Ronald C. Mullin, 533 Twin Oaks Cres.; Scott A. Vanstone, 333 Auburn Drive, all of Waterloo, Ontario, Canada

[21] Appl. No.: 739,220

[22] Filed: May 30, 1985

[51] Int. Cl.$^4$ .......................... G06F 7/52; G06F 7/38
[52] U.S. Cl. ..................................... 364/754; 364/746
[58] Field of Search ................................ 364/754–760, 364/746

[56] References Cited

U.S. PATENT DOCUMENTS

| 4,037,093 | 7/1977 | Gregg et al. | 364/754 |
| 4,251,875 | 2/1981 | Marver et al. | 364/754 |
| 4,587,627 | 5/1986 | Omura et al. | 364/754 |

OTHER PUBLICATIONS

C. C. Wang et al., "VLSI Architectures for Computing Multiplications and Inverses in GF ($2^m$), IEEE Trans. on Computers, vol. C-34, No. 8, Aug. 1985, pp. 709–717.

B. A. Laws, Jr. et al., "A Cellular-Array Multiplier for GF ($2^m$)", IEEE Trans. on Computers, vol. C-20, No. 12, Dec. 1971, pp. 1573–1578.

K. Z. Pekmestzi et al., "A Two's Complement Cellular Array Multiplier", The Radio and Electronic Engineer, vol. 51, No. 2, Feb. 1981, pp. 94–96.

Primary Examiner—Gary V. Harkcom
Assistant Examiner—Long Thanh Ngyuen
Attorney, Agent, or Firm—Fleit, Jacobson, Cohn & Price

[57] ABSTRACT

A multiplier for obtaining the product of two elements in the field GF($2^m$) utilises the normal basis representation of each element. The product is also represented in normal basis form with each binary digit of the bit vector being determined by a sum of the product of the binary digits representing the two elements. By grouping like ones of one of the binary digits in the expression for the binary digit of the product and offsetting the suffixes of the binary digits, it is possible to accumulate grouped terms of each of the binary digits of the product simultaneously.

27 Claims, 5 Drawing Sheets

COMPUTATIONAL METHOD AND APPARATUS FOR FINITE FIELD MULTIPLICATION

BACKGROUND OF THE INVENTION

1. Field of the Invention

The present invention relates to a method and apparatus for multiplying two elements in the finite field $GF(2^m)$.

2. Description of the Related Art

As explained fully in European application No. 0080528 from which the following discussion is taken, the finite field $GF(2^m)$ is a number system containing $2^m$ elements. Its attractiveness in practical applications results from the ability to represent each element by a vector of m binary digits. The practical application of error-correcting codes makes considerable use of computation in $GF(2^m)$. Both the encoding and decoding devices for the important Reed-Solomon codes must perform computations in $GF(2^m)$. The decoding device for the binary Bose-Chaudhuri-Hocquenghem codes also must perform computation in $GF(2^m)$. The reader is referred to "Error-Correcting Codes" by W. W. Peterson and E. J. Weldon, Jr., 2nd Ed., the M.I.T. Press, 1972, for details of these and other applications of $GF(2^m)$ computation for error-correction.

There exist cryptographic systems with encryption and decryption algorithms that require exponentiation operations on large numbers. Several public-key cryptosystems have been proposed that require or may be adapted to use the exponentiation of elements in $GF(2^m)$. Since the process of exponentiation consists of squaring and multiplication operations, it is essential that these operations be performed as quickly and efficiently as possible. The reader is referred to "Cryptography and Data Security" by D. E. Denning, Addison-Wesley, 1983, for desriptions of $GF(2^m)$ arithmetic and exponentiation algorithms, and for examples of public-key cryptosystems utilizing these algorithms. Recent advances in the art of secrecy coding also require the use of computation in $GF(2^m)$. The reader is referred to the letter "Implementing Public Key Scheme", by S. Berkovits, J. Kowalchuk and B. Schanning, IEEE Communications Magazine, Vol. 17, pp. 2-3, May 1979.

The finite field GF(2) is the number system in which the only elements are the binary numbers 0 and 1 and in which the rules of addition and multiplication are the following:

$$0+0=1+1=0$$
$$0+1=1+0=1$$
$$0\times 0=1\times 0=0\times 1=0 \quad (1)$$
$$1\times 1=1$$

These rules are commonly called modulo-two arithmetic. Hence all additions specified in logic expressions or by adders in this application are performed modulo two. In addition, multiplication is implemented with logical AND gates to correspond with the rule set out at (1) above. The finite field $GF(2^m)$, where m is an integer greater than 1, is the number system in which there are $2^m$ elements and in which the rules of addition and multiplication correspond to arithmetic modulo an irreducible polynomial of degree m with coefficients in GF(2). Although in an abstract sense there is for each m only one field $GF(2^m)$, the complexity of the logic circuitry required to perform operations in $GF(2^m)$ depends strongly on the particular way in which the field elements are represented.

The conventional approach to the design of logic circuitry to perform operations in $GF(2^m)$ is described in such papers as T. Bartee and D. Schneider, "Computation with Finite Fields", Information and Control, Vol. 6, pp. 79-98, 1963. In this conventional approach, one first chooses a polynomial P(X) of degree m which is irreducible over GF(2), that is P(X) has binary coefficients but cannot be factored into a product of polynomials with binary coefficients each of whose degree is less than m. An element A in $GF(2^m)$ is then defined to be a root of P(X), that is, to satisfy P(A)=0. The fact that P(X) is irreducible guarantees that the m elements $A^0=1, A, A^2, \ldots, A^{m-1}$ of $GF(2^m)$ are linearly independent over GF(2), that is, that $b_0+b_1A+b_2A^2+\ldots+b_{m-1}A^{m-1}$ vanishes only when the binary digits $b_0, b_1, b_2, \ldots, b_{m-1}$ are all zeroes. The conventional approach is then to assign the unit vectors of length m with binary components to the elements, $1, A, A^2, \ldots, A^{m-1}$.

As a specific example of the conventional approach, consider the finite field $GF(2^3)$ with the choice $$P(X)=X^3+X+1 \quad (2)$$

for the irreducible polynomial of degree 3. The next step is to define A as an element of $GF(2^3)$ such that $$A^3+A+1=0 \quad (3)$$

The following assignment of unit vectors is then made:

$$A^0=1=[0, 0, 1]$$
$$A=[0, 1, 0]$$
$$A^2=[1, 0, 0] \quad (4)$$

An arbitrary element B of $GF(2^3)$ is now represented by the binary vector $[b_2, b_1, b_0]$ with the meaning that $$B=[b_2,b_1,b_0]=b_2A^2+b_1A+b_0 \quad (5)$$

Let $C=[c_2,c_1,c_0]$ be a second element of $GF(2^3)$. It follows from equations (4) and (5) that $$B+C=[b_2+c_2, b_1+c_1, b_0+c_0]. \quad (6)$$

Thus, in the conventional approach, addition in $GF(2^m)$ is easily performed by logic circuitry that merely forms the modulo-two sum of the two vectors representing the elements to be summed component-by-component. Multiplication is, however, considerably more complex to implement. Continuing the example, one sees from equation (3) that $$A^3=A+1$$
$$A^4=A^2+A \quad (7)$$

where use has been made of the fact that $-1=+1$ in GF(2). From the equations (4), (5) and (7) it follows that $$B\times C=[d_2, d_1, d_0] \quad (8)$$

where $$d_0 = b_0c_0 + b_1c_2 + b_2c_1$$

$$d_1 = b_0c_1 + b_1c_0 + b_1c_2 + b_2c_1 + b_2c_2 \quad (9)$$

$$d_2 = b_0c_2 + b_2c_0 + b_1c_1 + b_2c_2$$

Complex logic circuitry is required to implement equations (9). Upon taking C=B equation (8), it follows from equation (9) that $$B^2 = [e_2, e_1, e_0] \quad (10)$$

where $$e_0 = b_0$$

$$e_1 = b_2 \quad (11)$$

$$e_2 = b_1 + b_2$$

and where use has been made of the facts that $b^2 = b$ and $b+b=0$ in GF(2). Whereas the squaring rule of equations (11) is considerably simpler to implement than the multiplication rule of equations (9), it still has the disadvantage that some additions (in the example, only one) must be performed and that the form of the squaring rule varies among the components of the square.

By way of summary, one can say that the conventional approach to the design of logic circuitry to perform operations in GF($2^m$) leads to simple circuitry for addition, somewhat more complex circuitry for squaring, and very complex circuitry for multiplication.

In the European application No. 0080528 noted above advantage was taken of the following special features of the finite field GF($2^m$). There always exists a so-called normal basis for this finite field, that is, one can always find a field element A such that A, $A^2$, $A^4$, ..., $A^{2m-1}$ are a basis for GF($2^m$) in the sense that every field element B can be uniquely written as $$\begin{aligned} B &= b_{m-1}A^{2m-1} + \ldots + b_2A^4 + b_0A \\ &= [b_{m-1}, \ldots, b_2, b_1, b_0] \end{aligned} \quad (12)$$

where $b_0, b_1, b_2, \ldots, b_{m-1}$ are binary digits. Moreover, squaring in GF($2^m$) is a linear operation in the sense that for every pair of elements B and C in GF($2^m$)

$$(B+C)^2 = B^2 + C^2 \quad (13)$$

Further, it is the case for every element B of GF($2^m$) that $$B^{2m} = B \quad (14)$$

The inventors in the above application sought to simplify the multiplication procedure by initially choosing a polynomial P(X) of degree m which is irreducible over GF(2) and which has linearly independent roots. This latter condition on P(X) insures that upon defining A as an element of GF($2^m$) such that P(A)=0 then A, $A^2$, $A^4$, ... $A^{2m-1}$ form a normal basis for GF($2^m$).

For a discussion of normal bases in finite fields, the reader is referred to "Finite Fields" by Lidl and Neidereiter. Then if $B = [b_{m-1}, \ldots, b_2, b_1, b_0]$ and $C = [c_{m-1}, \ldots, c_2, c_1, c_0]$ are any two elements of GF($2^m$) in said normal basis representation, then the product $$D = B \times C = [d_{m-1}, \ldots, d_2, d_1, d_0] \quad (15)$$

has the property that the same logic circuitry which when applied to the components or binary digits of the vectors representing B and C produces $d_{m-1}$ will sequentially produce the remaining components $d_{m-2}, \ldots, d_2, d_1, d_0$ of the product when applied to the components of the successive rotations of the vectors representing B and C.

This may be appreciated by considering the binary digits $d_2$, $d_1$, $d_0$ of e.g. equation (9) above where $$d_2 = b_1c_1 + b_0c_1 + b_1c_0 + b_0c_2 + b_2c_0$$

$$d_1 = b_0c_0 + b_2c_0 + b_0c_2 + b_2c_1 + b_1c_2$$

$$d_0 = b_2c_2 + b_1c_2c + b_2c_1 + b_1c_0 + b_0c_1$$

Like ones of one of the binary digits $b_i$ or $c_i$ are grouped to obtain grouped terms so that these may be rewritten in the form $$d_2 = b_0(c_1 + c_2) + c_0(b_1 + b_2) + b_1c_1$$

$$d_1 = b_2(c_0 + c_1) + c_2(b_0 + b_1) + b_0c_0$$

$$d_0 = b_1(c_2 + c_0) + c_1(b_2 + b_0) + b_2c_2$$

Where an expression such as $b_0(c_1 + c_2)$ is subsequently referred to as a grouped term. Thus the logic equation for $d_1$ could be derived from that for $d_2$ by reducing the suffix of all binary digits $b_i$, $c_i$, by 1 (Modulo-3). A practical implementation was achieved by entering the vectors in respective shift registers, establishing connections and implementing digital logic circuitry to generate all terms of the component $d_2$ simultaneously. Then the shift register contents are rotated one bit position to obtain $d_1$, and, similarly $d_0$. Thus, by rotating the vectors B and C in the two shift registers, the binary digits of the product vector D could be generated by the one logic circuit.

However, whilst the above proposal is more efficient than the conventional approach, it suffers the disadvantage that all grouped terms constituting one binary digit of the vector must be added simultaneously at one location. This makes the implementation of the logic complicated, and for large values of m, (e.g. greater than 250), impractical. The above European application also proposes the simultaneous or parallel generation of all m binary digits of the product vector by m identical multiplier logic circuits. However, this simply compounds the difficulty of logic implementation because of the increase in external shift register connections and the large amount of circuitry required.

SUMMARY OF THE INVENTION

The applicants have recognised that multiplication may be implemented by storing bit vectors B and C in respective shift registers and establishing connections to respective accumulating cells such that a grouped term of each of the expressions $d_i$ is generated in respective ones of m accumulating cells. By rotating the bit vectors B and C in the shift registers and by rotating the contents of the accumulating cells each grouped term of a respective binary digit $d_i$ is accumulated in successive cells. Thus all of the binary digits of the product vector are generated simultaneously in the accumulating cells after one complete rotation of the bit vectors B and C.

BRIEF DESCRIPTION OF THE DRAWINGS

Embodiments of the invention will now be described by way of example only with reference to the accompanying drawings in which.

DETAILED DESCRIPTION

Figure 1:
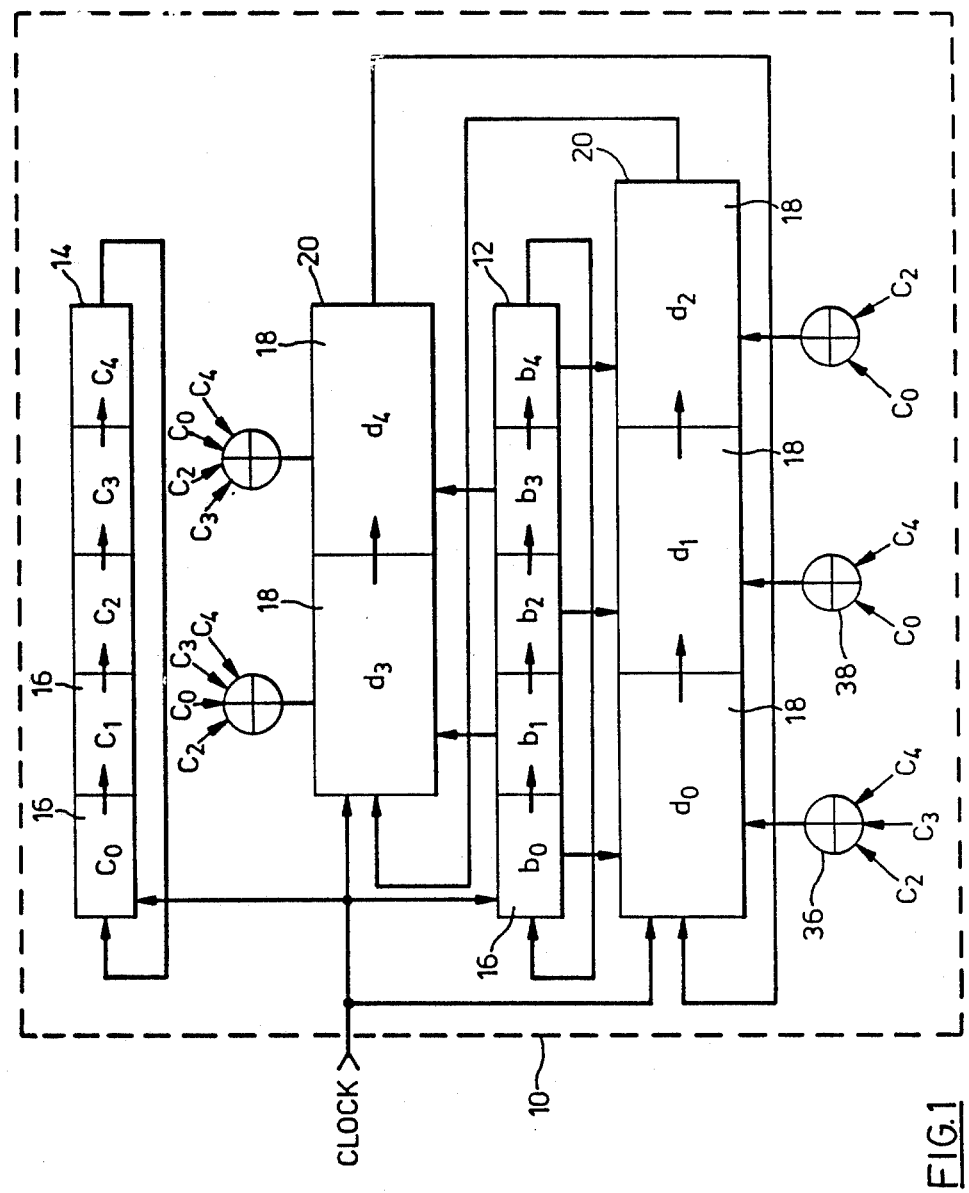
FIG. 1 is a block diagram of a multiplier to implement multiplication of two elements in the field $GF(2^5)$.
Figure 2:
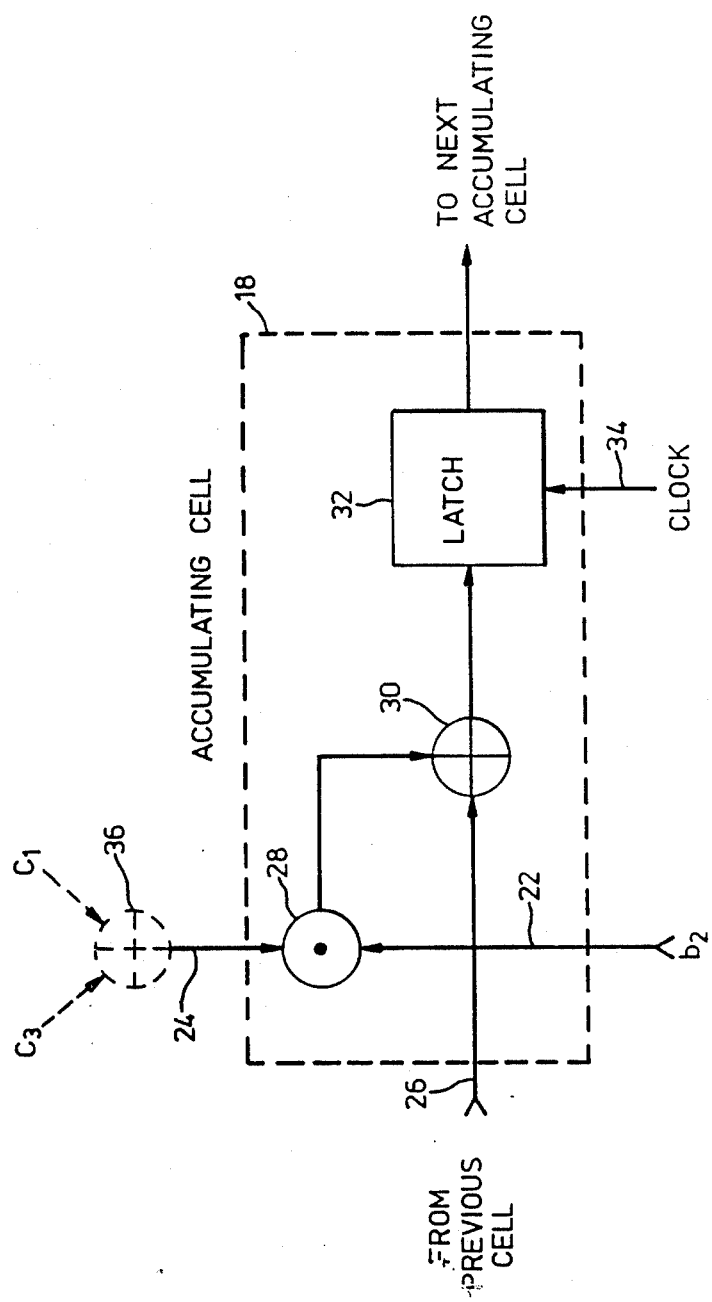
FIG. 2 is a block logic diagram of a component used in the multiplier of FIG. 1.

The principle of operation may best be understood by reference to FIGS. 1 and 2 that represents the logic implementation for multiplying two elements in the finite field $GF(2^5)$. Before referring to the figures in detail, it will be useful to consider the form of the product D of two elements B and C.

B will be of the form $B=(b_0, b_1, b_2, b_3, b_4)$ in normal basis representation and C will be of the form $C=(c_0, c_1, c_2, c_3, c_4)$ in normal basis representation.

The product D will be of the form $D=(d_0, d_1, d_2, d_3, d_4)$ in normal basis representation. Each of the bit vectors $d_i$ will consist of grouped terms of the binary digits representing B and C and for the case where $m=5$ $$d_i = b_{i+4}(c_{i+4} + c_{i+3} + c_{i+1} + c_i) + b_{i+3}$$
$$(c_{i+4} + c_{i+2} + c_{i+1} + c_i) + b_{i+2}(c_{i+3} + c_i)$$
$$b_{i+1}(C_{i+4} + C_{i+3})$$
$$+ b_i(c_{i+4} + c_{i+3} + c_{i+2})$$

In general, all subscripts are added using modulo 5 arithmetic. Thus the binary digits have the form:

$$d_0 = b_4(c_4 + c_3 + c_1 + c_0) + b_3(c_4 + c_2 + c_1 + c_0) +$$
$$b_2(c_3 + c_0) + b_1(c_4 + c_3) + b_0(c_4 + c_3 + c_2)$$
$$d_1 = b_0(c_0 + c_4 + c_2 + c_1) + b_4(c_0 + c_3 + c_2 + c_1) +$$
$$b_3(c_4 + c_1) + b_2(c_0 + c_4) + b_1(c_0 + c_4 + c_3)$$
$$d_2 = b_1(c_1 + c_0 + c_3 + c_2) + b_0(c_1 + c_4 + c_3 + c_2) +$$
$$b_4(c_0 + c_2) + b_3(c_1 + c_0) + b_2(c_1 + c_0 + c_4)$$
$$d_3 = b_2(c_2 + c_1 + c_4 + c_3) + b_1(c_2 + c_0 + c_4 + c_3) +$$
$$b_0(c_1 + c_3) + b_4(c_2 + c_1) + b_3(c_2 + c_1 + c_0)$$

and
$$d_4 = b_3(c_3 + c_2 + c_0 + c_4) + b_2(c_3 + c_1 + c_0 + c_4) +$$
$$b_1(c_2 + c_4) + b_0(c_3 + c_2) + b_4(c_3 + c_2 + c_1)$$

It will be appreciated from the above that by establishing logic connections to generate the first grouped term $b_4(c_4+c_3+c_1+c_0)$ of $d_0$, the first grouped term of the binary digits $d_4$, $d_3$, $d_2$, and $d_1$ will also be generated by these same connections if the bit vectors of B and C are successively rotated one place to the right. The applicants have recognized that if connections are also established to generate the second grouped term of $d_o$ after the generation of the first grouped term and the bit vectors have been rotated, the connections will in fact generate the second grouped term of $d_1$ prior to rotation of the bit vectors B and C. Thus by establishing connections to generate successive group terms of the binary digits $d_0$ in successive clock cycles, it is possible to accumulate in parallel each of the binary digits of the product vector. This simplifies implementation of the logic.

Referring therefore to FIG. 1, a multiplier 10 includes a pair of shift registers 12, 14 each having m cells 16. Shift registers 12 and 14 are loaded with bit vectors B and C respectively so that each cell 16 contains one of the binary digits $b_i$ or $c_i$.

The shift registers 12, 14 are connected, in a manner to be described below, to the respective ones of accumulating cells 18 of a term accumulating register 20. The register 20 will have m cells 18 each of which is configured as shown in FIG. 2. Referring to FIG. 2, each cell 18 receives a pair of inputs 22, 24 that originate from the shift registers 12, 14 respectively and an input 26 from the adjacent cell 18 of the register 20. The inputs 22, 24 are connected to inputs of an AND gate 28. The output of gate 28 is added to the input 26 at MOD 2 ADDER 30 whose output is connected to a latch 32. The output of latch 32 forms the input 26 of the next cell 18 and receives a clock signal 34 to store the output of ADDER 30.

The nature of inputs 22, 24 is determined by the connections implemented between the cells 16 of shift registers 12, 14 and the cell 18. The connections are arranged such that one grouped term of the binary digits $d_i$ is generated at the output of AND gate 28. Thus for the binary digits $d_0$ to $d_4$ shown above, the binary digits $b_0$ to $b_4$ and $c_o$ to $c_4$ are stored in shift registers 12, 14 respectively as indicated in FIG. 1. A first grouped term of $d_0$ is to be accumulated in cell 18 indicated as $d_0$ in FIG. 1, i.e. the output of AND gate 42 will represent the grouped term $b_0(c_4+c_3+c_2)$. To implement this, a connection is established from the cell 16 of shift register 12 containing the binary digit $b_0$ to form input 22. Connections from cells 16 of shift register 14 containing binary digits $c_4$, $c_3$ and $c_2$ are made to ADDER 36 whose output, representing $c_4+c_3+c_2$, forms the input 24 to AND gate 28. The output of AND gate 28 will thus be $b_0(c_4+c_3+c_2)$.

Connections are made between the shift registers 12, 14 and the cell 18 indicated as $d_1$ to generate the penultimate grouped term of $d_1$, i.e. the term $b_2(c_0+c_4)$. Thus cells 16 of shift register 14 containing the binary digits $c_0$ and $c_4$ are connected to adder 38 whose output forms input 24 of the cell 18 designated $d_1$ and cell 16 of shift register 12 containing binary digit $b_2$ is connected as the input 22 of cell 18 designated $d_1$ so that the output of AND gate 28 is $b_2(c_0+c_4)$.

Similarly the shift registers 12, 14 are connected to the cell 18 indicated $d_2$ to generate the third term of binary digit $d_2$, i.e. $b_4(c_0+c_2)$; to the cell 18 indicated $d_3$ to provide the second term of binary digit $d_3$, i.e. $b_1(c_2+c_0+c_4+c_3)$; and to the cell 18 indicated $d_4$ to produce the first term of binary digit $d_4$, i.e. $b_3(c_3+c_2+c_0+c_4)$.

In general, therefore, the jth cell 18 of accumulating register 20 is connected to the shift registers 12, 14 to produce the jth grouped term of a binary digit $d_i$ with the subscripts of binary digits $b_i$ and $c_1$ increased by $j-1$ using modulo m arithmetic. This adjustment of the subscripts of the grouped term is called "offsetting" and ensures that each of the m accumulating cells generates one grouped term of each of the binary digits $d_i$ during each of m successive clock cycles.

With the connections established the binary digits $d_0$ to $d_5$ can be generated as follows.

First, the binary digits $b_0$ to $b_5$ are loaded into shift register 12 and the binary digits $c_0$ to $c_5$ are loaded into shift register 14. These may be loaded in parallel or in series as is most appropriate for the particular shift register utilised. The contents of the latches 32 of the cells 18 of accumulating register 20 are cleared by loading zeroes into each. Upon initiation of the multiplication, the grouped terms corresponding to the connections noted above will be generated at the output of each AND gate 28. Because each of the inputs 26 is zero the outpus of the MOD 2 ADDER 30 in each case will correspond to the output of the AND gate 28.

On the first rising edge of the clock signal, the output, of each ADDER 30 is entered into the corresponding latch 32 to appear as the input of the adjacent cell 18. Thus, latch 32 of cell 18 designated $d_0$ will contain the term $b_0(c_4+c_3+c_2)$, latch 32 of cell 18 designated $d_1$ will contain the term $b_2(c_0+c_4)$ etc. The first rising edge of the clock signal causes the simultaneous rotation one position to the right of the contents of registers 12, 14 respectively so that the binary digits $b_i$ and $c_i$ are transferred to an adjacent cell. Thus, the inputs to cell 18 designated $d_0$ will now be $b_4$ from shift register 12 and $(c_1+c_2+c_3)$ from the adder 36. The output of AND gate 28 of cell 18 designated $d_0$ will thus be $b_4(c_1+c_2+c_3)$. The input 26 of cell 18 ($d_0$) will be the contents of latch 32 of cell 18 ($d_4$), i.e. $b_3(c_3+c_2+c_0+c_4)$ and thus the output of the MOD 2 ADDER 30 of cell 18 ($d_0$) will be $b_4(c_1+c_2+c_3)+b_3(c_3+c_2+c_0+c_4)$. It will be seen that this corresponds to two grouped terms of the binary digit $d_4$ set out above. A careful consideration of the output of each ADDER 30 will show that the sum of two grouped terms of each binary digit $d_i$ will appear as the input of respective latches 32.

On the next rising edge of the clock signal, the outputs of each ADDER 30 will be entered into respective latches 32 and the binary digits $b_i$ and $c_i$ rotated in the shift registers 12, 14 respectively. Thus, the contents of the latch of cell 18 ($d_0$), namely $b_4(c_1+c_2+c_3)+b_3(c_3+c_2+c_0+c_4)$ will be present as input 26 of cell 18 ($d_1$) and the output of AND gate 28 of cell 18 ($d_1$) will be $b_0(c_2+c_3)$, i.e. a third grouped term of the binary digit $d_4$. It will be appreciated that after five clock cycles, the sum of all grouped terms of the binary digit $d_4$ will be stored in the latch of cell 18 designated $d_3$ and similarly the sum of all the grouped terms of binary digits $d_3$ to $d_0$ will be stored in respective ones of cells 18. Thus, the bit vector constituting the normal basis representation of product D is available by reading the contents of the accumulating register 20.

It will also be noted the connections from the cells 16 of shift registers 12, and 14 are distributed amongst the cells 18 of accumulating register 20 to reduce the number of inputs of any adder.

Figure 3:
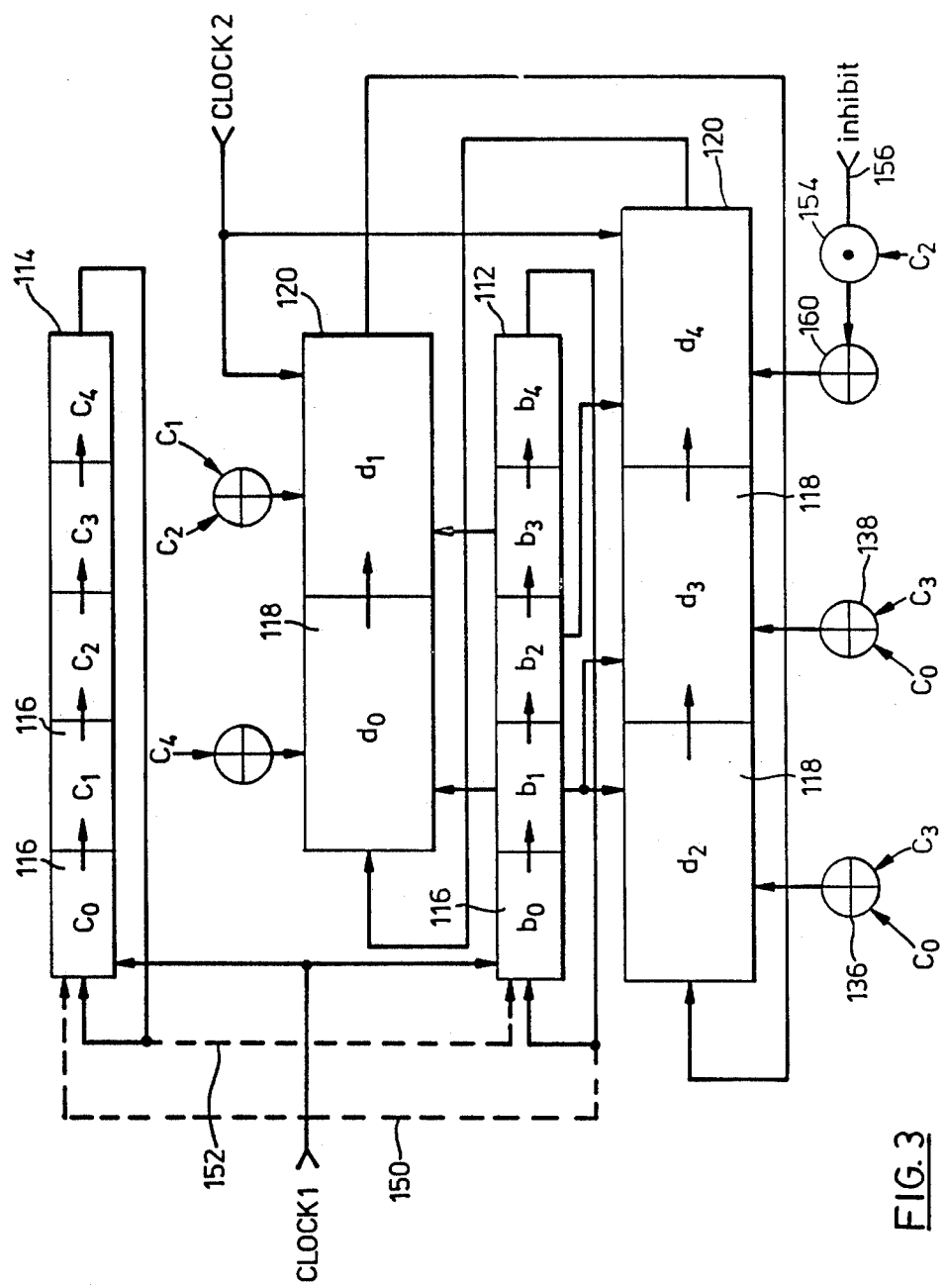
FIG. 3 is a block diagram of an alternative form of multiplier to implement multiplication of two elements in the field $GF(2^5)$.

Whilst the above multiplier constitutes a significant improvement over that described in the European patent application No. 0080528, the number of connections may be reduced further although the number of clock cycles required to generate the binary digits $d_i$ is increased. A multiplier for the field $GF(2^5)$ is shown in FIG. 3 and is similar to that shown in FIG. 1. Accordingly the reference numerals used in the description of FIGS. 1 and 2 will be used to identify like components with a prefix 100 added, i.e. reference numeral 12 will become 112. The arrangement shown in FIG. 3 differs in two important ways, namely the provision for exchanging the contents of shift registers 112 and 114 as indicated by dashed lines 150, 152 and the nature of the connections between the cells 116 and cells 118. It will also be noted that the shift registers 112, 114 are controlled by a separate clock signal, indicated at clock 1, to the accumulating register 120 whose clock signal is indicated at clock 2.

The nature of the connections is established from a further manipulation of the terms representing the binary digits $d_i$. Thus considering the binary digit $d_4$ above, this may be written as:

$$b_3c_3+b_3c_2+b_3c_0+b_3c_4+b_2c_3+b_2c_1+b_2c_0+$$
$$b_2c_4+b_1c_2+b_1c_4+b_0c_3+b_4c_3+b_4c_2+b_4c_1$$

and rearranged as:

$$b_3c_3 + [b_3c_2 + b_2c_3] + [b_3c_0 + b_0c_3] + [b_3c_4 +$$
$$b_4c_3] + [b_2c_1 + b_1c_2] + [b_2c_4 + b_4c_2] +$$
$$[b_1c_4 + b_4c_1]$$

It will be observed that the terms within the brackets [ ] possess a symmetry such that if one product term is of the form $b_jc_k$, the other product term is obtained by interchanging the suffixes, i.e. $b_kc_j$. It has been recognised that by implementing the logic to produce one product term of each pair, the other product term may be obtained from a simple interchange of the contents of the shift registers and by a repeated circuit operation each of the product terms of each pair may be obtained. Moreover, the offsetting principle still applies so that the terms of each binary digit will be generated in parallel. The expression for digit $d_4$ is

| X | Y | Z |
|---|---|---|
| $b_3c_3$ + | $b_3c_2$ + | $b_2c_3$ |
| + | $b_3c_0$ + | $b_0c_3$ |
| + | $b_3c_4$ + | $b_4c_3$ |
| + | $b_2c_1$ + | $b_1c_2$ |
| + | $b_2c_0$ + | $b_0c_2$ |
| + | $b_2c_4$ + | $b_4c_2$ |
| + | $b_1c_4$ + | $b_4c_1$ |

The product terms in column Y are then selected and like terms grouped as discussed above with reference to FIG. 1. Thus column Y may be expressed as $b_3(c_2+c_0+c_4)+b_2(c_1+c_0+c_4)+b_1c_4$. By implementing the logic to generate these terms in successive cells 118 of accumulating register 120, the terms of column Z will also be generated after interchange of the shift registers 112, 114 by a second pass through the accumulating cells. The odd term of column X may be generated during one of the two passes through the cells 118 with its generation inhibited during the other pass.

It will be noted that the grouped terms of column Y would require 3 inputs to two of the ADDERS whilst only 3 of the accumulating cells 118 are utilised. In order to spread the connections evenly between the cells 118, the expression is modified to select one of each pair of product terms but obtain a different grouping. Thus, in the example above, the third and sixth product terms are selected from column Z rather than Y so that the expression $b_3(c_2+c_0)+b_4(c_3+c_2)+b_2(c_1+c_0)+b_1c_4$ is to be implemented. This increases the number of cells 118 utilised and reduces the number of connections to some of the ADDERS.

Referring therefore to FIG. 3, the final term $b_1c_4$ is implemented in the cell 118 designated $d_o$ (referred to hereafter as 118 [$d_0$]) by connecting cell 116 of shift register 112 containing binary digit $b_1$ and cell 116 of shift register 114 containing binary digit $c_4$ to the AND gate 128. The connections to the second of cells 118 is established from a second term with the suffixes of the binary digits increased by 1, Modulo 5 i.e. $b_3(c_2+c_1)$ and in general the jth cell 118 accumulates a jth term of the expression with suffixes increased by $j-1$ (Modulo m).

Connections are also established to implement the odd term $b_3c_3$ of column X in cell 118 designated $d_4$. The connections to $d_4$ are modified to include an AND gate 154 to inhibit the accumulation of the add terms e.g. $b_3c_3$. The AND gate 154 is located between the cell 116 designated $c_3$ and ADDER 160 and receives as one input the output of cell 116 and as its other input an inhibit signal 156 derived from the clock signal. When the inhibit signal 156 is logic level 0, the output of AND gate 154 will be zero so that zero will be added by ADDER 130 to the contents of the latch 136 of the previous cell 118 [$d_3$].

With the connections established, the binary digits $b_0$ to $b_4$ and $c_0$ to $c_4$ are loaded in respective cells 116 of shift registers 112, 114. The contents of each cell 118 is cleared so that each latch 132 contains 0 and the inhibit signal 156 is held at logic level 0 to force the output of AND gate 154 to also be zero.

The contents of the shift registers 112, 114 and the cells 118 are then rotated one bit position rightwards by successive clock cycles so that after m clock cycles one of each part of the paired product terms is accumulated in respective cells 118. The generation of the terms is shown in table 1 below.

Thus, it will be seen that the terms in $d_4$ correspond to the rewritten expression for one of each of the pairs of product terms.

After five clock cycles, registers 112, 114 will have undergone a complete rotation so that binary digits $b_i$ and $c_j$ will be stored in the cells 116 in which they were initially loaded.

Figure 4:
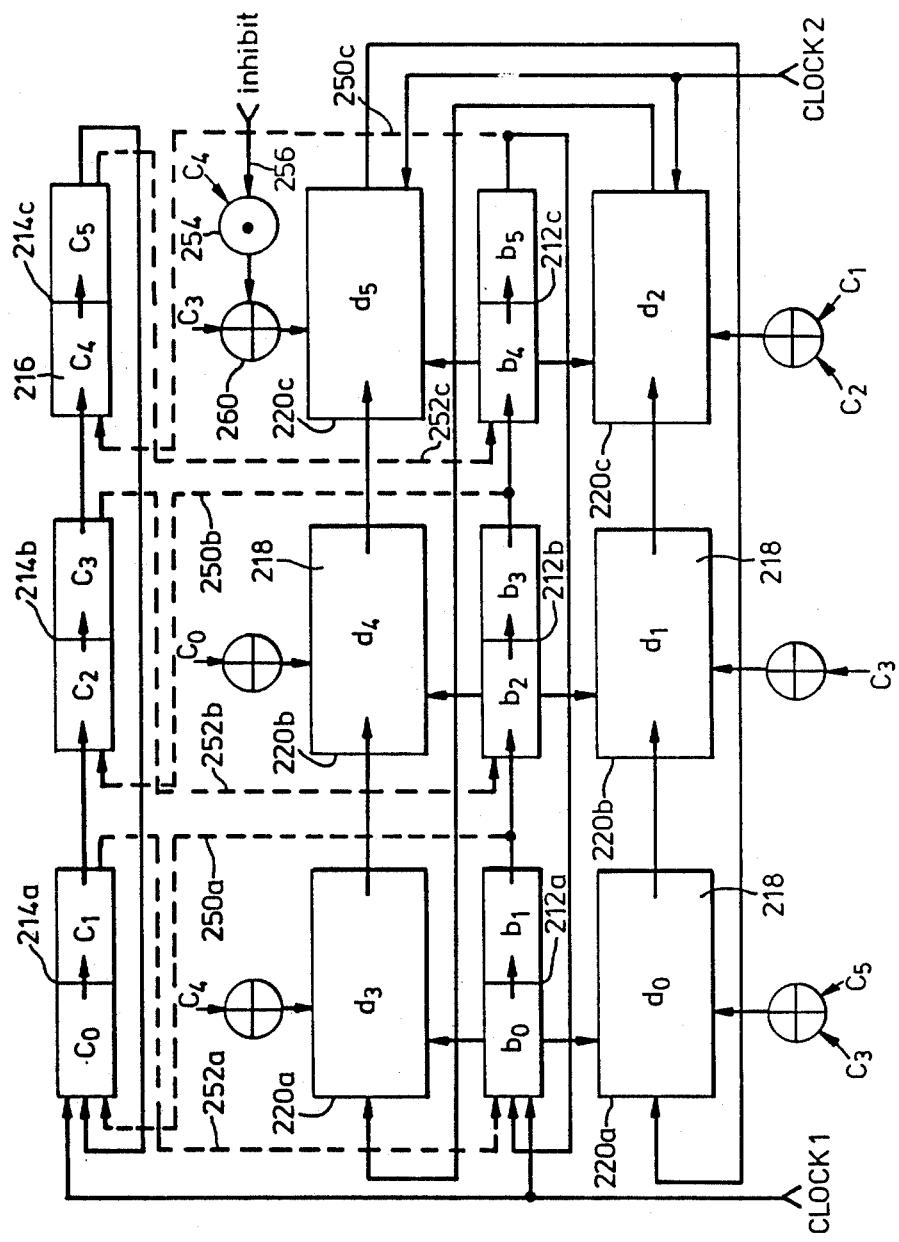
FIG. 4 is a block diagram of a further embodiment of a multiplier to implement multiplication in the field $GF(2^6)$.

Now the contents of the shift registers 112 and 114 are exchanged through connections 150, 152. This may be accomplished by shifting the contents of both registers 112, 114 for five clock cycles as a serial, circular exchange or alternately could be achieved by parallel connections between cells 116. Serial exchange is shown in FIG. 4 and is easiest to implement for large values of m. During the exchange, clock 1 goes through five cycles while clock 2 is held low to prevent unwanted terms accumulating in register 120. When binary digits $d_i$ pass through accumulating cells, both clock signals are identical.

After the exchange of binary digits, the inhibit signal 156 is set to logic level 1 so that AND gate 154 passes the input from cell 116 to the input of ADDER 160. The circuit operation then continues as exemplified by the table below for the next five clock cycles. Again, it will be seen that the terms of each of the binary digits $d_i$ are accumulated in each of the cells 118 in parallel so that after 2m clock cycles of computation the binary digits of D are available in the cells 118 of accumulating register 120. Because of the need to exchange the contents of the shift registers 112, 114, additional clock cycles are required to complete the computation. However, the number of the connections between the shift registers and the accumulating register in the multiplier of FIG. 3 is less than those shown in the multiplier of FIG. 1 to compensate for this.

The implementation shown in FIG. 3 has been used to illustrate the generality of the above principle. However, in practical implementations particularly for large values of m, the connections may be simplified further by selecting the grouped terms in ascending order of the coefficient $b_i$ or $c_i$. In this manner a maximum of two connections between each cell of one of the shift registers and the accumulating register is obtained.

In order to reduce the time taken to compute the binary digits $d_i$, the multiplier of FIG. 3 can be further modified as shown in FIG. 4. Again like components will be identified by like reference numerals with a prefix 2 added for clarity. FIG. 4 shows a multiplier for generating the binary digits $d_i$ in the field $GF(2^6)$. It will be noted that the shift registers 212 and 214 have been segmented into 3 units, 212$a$, $b$, or $c$ and 214$a$, $b$ or $c$ respectively, each having two cells 116. Similarly, the accumulating register 220 is segmented into 3 units 220$a$, $b$ or $c$ each having two cells. It will be noted that each of the shift register units 212$a$, $b$, and $c$ is connected to a corresponding shift register unit 214$a$, $b$ and $c$ by paths 250$a$, $b$, $c$, and 252$a$, $b$, $c$ respectively. The paths 250,252 are utilised to exchange the contents of the registers 212, 214 between units a, b and c rather than through the entire shift register. In this way the number of clock cycles necessary to transfer the contents of the shift register is reduced from m to the number of cells 216 in each unit.

The binary digit $d_5$ of product D in $GF(2^6)$ is given by $$d_5 = b_5c_5 + b_5c_4 + b_4c_5$$
$$+b_2c_5 \quad +b_5c_2$$
$$+b_0c_5 \quad +b_5c_0$$
$$+b_1c_2 \quad +b_2c_1$$
$$+b_3c_1 \quad +b_1c_3$$
$$+b_4c_2 \quad +b_2c_4$$
$$+b_0c_3 \quad +b_3c_0$$
$$+b_2c_0 \quad +b_0c_2$$

Thus by implementing the expression $b_0(c_3+c_5)+b_1c_2+b_2(c_0+C_5)+b_3c_1+b_4c_2+b_5(c_4+c_5)$ the binary digits $d_i$ of the normal basis representation of the product D can be generated. It is believed to be apparent from the above discussion that the initial connections to be established are as follows:

| cell 118 | physical connection |
| --- | --- |
| $d_0$ | $b_0(c_3 + c_5)$ |
| $d_1$ | $b_2c_3$ |
| $d_2$ | $b_4(c_2 + c_1)$ |
| $d_3$ | $b_0c_4$ |

-continued

| cell 118 | physical connection |
|---|---|
| $d_4$ | $b_2c_0$ |
| $d_5$ | $b_4(c_3 + c_4)$ |

In this case, the odd term is generated initially in cell 218 [$d_5$] and the input to the adder 236 associated with cell 218 [$d_5$] that is initially from the cell 216 containing digit $c_4$ is inhibited after the first pass through the accumulating register 220 by use of an AND gate in a manner similar to that shown in FIG. 3.

The operation of the multiplier of FIG. 4 is similar to that described above with reference to FIG. 3. However, exchange of the contents of the registers 212, 214 occurs over the lines 250, 252 to reduce from 6 to 2 the number of clock cycles necessary to complete the exchange.

It is believed the above examples clearly and explicitly explain the operation of $GF(2^m)$ the multiplier. Relatively small values of m have been selected for the sake of simplicity but it will be apparent that the above principles apply for large values of m usually employed in encryption.

However, for the larger values of m usually utilised in encryption, the number of product terms in the expression for binary digit $d_i$ may increase quadratically with the value of m. This renders the implementation of a multiplier impractical because of the large number of connections necessary. For those values of m listed in Table 3 there does exist an optimal normal basis in the sense that it yields an expression $d_i$ that has $2m-1$ product terms, the smallest number possible. Each of the integers m has an indication of type for use in the computer program discussed below. The binary digits $b_i c_j$ of the binary digit $d_0$ of the product vector D for the optimal normal basis of a value of m listed in Table 3 may be obtained executing the computer program listed in appendix 1. By running the program for m=6 the following results were obtained:

$$d_0 = \begin{array}{cc} b & c \\ 5 & 5 \\ 0 & 1 \\ 1 & 0 \\ 4 & 1 \\ 1 & 4 \\ 5 & 3 \\ 3 & 5 \\ 4 & 2 \\ 2 & 4 \\ 3 & 2 \\ 2 & 3 \end{array}$$

which yields the equation for $d_0$ as:

$$d_0 = b_5C_5 + b_0 + C_1 + b_1C_0 + b_4C_1 + b_1C_4 + b_5C_3 + b_3C_5 + b_4C_2 + b_2C_4 + b_3C_2 + b_2C_3$$

Figure 5:
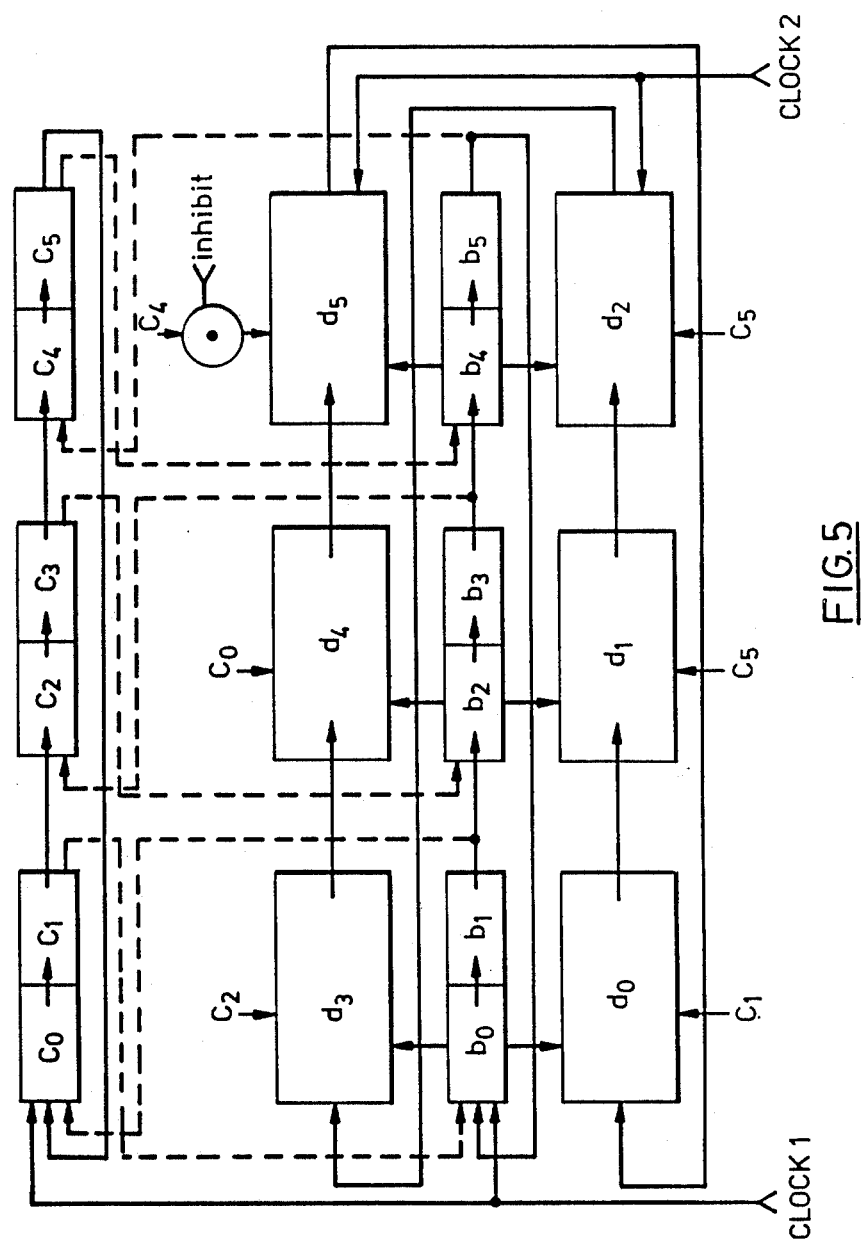
FIG. 5 is a block diagram of the multiplier of FIG. 4 with the connections modified for an optimal implementation of a $GF(2^6)$ multiplier.

FIG. 5 shows the implementation of this expression for the segmented $GF(2^6)$ multiplier shown in FIG. 4 with appropriate modifications to the connections to implement the above. The rearrangement of $d_0$ to obtain these connections will be apparent from the above and consideration of FIG. 5.

An optimal multiplier design exists for every value of m listed in Table 3 such that every accumulating cell 218 has a single input from same shift register cell 216. Thus, m modulo-two ADDERS are eliminated as compared to the multipliers of FIGS. 1, 3 and 4 further simplifying the circuitry.

In addition, the applicants believe that the maximum number of connections to the output of any shift register cell 216 is three.

The above description has utilised block diagram representations of the registers 12, 14, 20 and the adders and logic functions. However, it is believed that the selection and operation of the components to perform the functions discussed above will be apparent to a person skilled in the art of digital logic design and that further particularisation of the components is not necessary.

Clearly different offset patterns may be chosen whilst utilising the principle of parallel generation of terms of each of the binary digits of $d_i$.

TABLE 1

| CLOCK CYCLE | $d_0$ | $d_1$ | $d_2$ | $d_3$ | $d_4$ |
|---|---|---|---|---|---|
| 1 | $b_1c_4$ | $b_3(c_2 + c_1)$ | $b_1(c_0 + c_4)$ | $b_1(c_0 + c_3)$ | 0 |
| 2 | $0 + b_0c_3$ | $b_1c_4 + b_2 (c_1 + c_0)$ | $b_3(c_2 + c_1) + b_0(c_4 + c_3)$ | $b_1(c_0 + c_4) + b_0(c_4 + c_2)$ | $b_1(c_0 + c_3) + 0$ |
| 3 | $b_1(c_0 + c_3) + b_4c_2$ | $b_0c_3$ $b_1(c_0 + c_4)$ | $b_1c_4 + b_2$ $b_4(c_3 + c_2)$ | $b_3(c_2 + c_1) + b_0(c_4 + c_3) + b_4(c_3 + c_1)$ | $b(c_0 + c_4) + b_0(c_4 + c_2) + 0$ |
| 4 | $b_1(c_0 + c_4) + b_0(c_4 + c_2) + b_3c_1$ | $b_1(c_0 + c_3) + b_4c_2 + b_0(c_4 + c_3)$ | $b_0c_3 + b_1 (c_0 + c_4) + b_3(c_2 + c_1)$ | $b_1c_4 + b_2 (c_1 + c_0) + b_4(c_3 + c_2) + b_3(c_2 + c_1)$ | $b_3(c_2 + c_1) + b_0(c_4 + c_3) + b_4(c_3 + c_1) + 0$ |
| 5 | $b_3(c_2 + c_1) + b_0(c_4 + c_3) + b_4(c_3 + c_1) + b_2c_0$ | $b_1(c_0 + c_4) + b_0(c_4 + c_2) + b_3c_1 + b_4(c_3 + c_2)$ | $b_1(c_0 + c_3) + b_4c_2 + b_0(c_4 + c_3) + b_2(c_1 + c_0)$ | $b_0c_3 + b_1(c_0 + c_4) + b_3(c_2 + c_1) + b_2(c_1 + c_4)$ | $b_1c_4 + b_2$ $(c_1 + c_0) + b_4$ $(c_3 + c_2) + b_3$ $(c_2 + c_0) + 0$ |

TABLE 2

| CLOCK CYCLE | $d_0$ | $d_1$ | $d_2$ | $d_3$ | $d_4$ |
|---|---|---|---|---|---|
| 6 | $b_1c_4 + b_2$ $(c_1 + c_0) +$ $b_4(c_3 + c_2) +$ $b_3(c_2 + c_0) +$ $c_1b_4$ | $b_3(c_2 + c_1) +$ $b_0(c_4 + c_3) +$ $b_4(c_3 + c_1) +$ $b_2C_0 + C_3$ $(b_2 + b_1)$ | $b_1(c_0 + c_4) +$ $b_0(c_4 + c_2) +$ $b_3c_1 + b_4$ $(c_3 + c_2) +$ $c_1(b_0 + b_4)$ | $b_1(c_0 + c_3) +$ $b_4c_2 +$ $b_0(c_4 + c_3) +$ $b_2(c_1 + c_0) +$ $c_1(b_0 + b_3)$ | $b_0c_3 + b_1$ $(c_0 + c_4) + b_3$ $(c_2 + c_1) + b_2$ $(c_1 + c_4) +$ $c_2b_2$ |
| 7 | $b_0c_3 +$ $b_1(c_0 + c_4) +$ $b_3(c_2 + c_1) +$ $b_2(c_1 + c_4) +$ $c_2b_2b_3$ | $b_1c_4 + b_2$ $(c_1 + c_0) +$ $b_4(c_3 + c_2) +$ $b_3(c_2 + c_0) +$ $c_1b_4 +$ $c_2(b_1 + b_0)$ | $b_3(c_2 + c_1) +$ $b_0(c_4 + c_3)$ $b_4(c_3 + c_1) +$ $b_2c_0 + c_3$ $(b_2 + b_1) + c_0$ $(b_4 + b_3)$ | $b_1(c_0 + c_4) +$ $b_0(c_4 + c_2) +$ $b_3c_1 + b_4$ $(c_3 + c_2) + c_1$ $(b_0 + b_4) + c_0$ $(b_4 + b_2)$ | $b_1(c_0 + c_3) +$ $b_4c_2 + b_0$ $(c_4 + c_3) + b_4$ $(c_3 + c_2) + c_1.$ $(b_0 + b_3) +$ $c_1b_1$ |
| 8 | $b_1(c_0 + c_3) +$ $b_4c_2 +$ $b_0(c_4 + c_3) +$ $b_4(c_3 + c_2) +$ $c_1(b_0 + b_3) +$ $c_1b_1 +$ $c_4b_2$ | $b_0c_3$ $b_1(c_0 + c_4)$ $b_3(c_2 + c_1) +$ $b_2(c_1 + c_4) +$ $c_2b_2 +$ $c_0b_3 + c_1$ $(b_0 + b_4)$ | $b_1c_4 +$ $b_2(c_1 + c_0) +$ $b_4(c_3 + c_2) +$ $b_3(c_2 + c_0) + $ $c_1b_4 +$ $c_2(b_1 + b_0) +$ $c_4(b_2 + b_3)$ | $b_3(c_1 + c_2)$ $b_0(c_4 + c_3) +$ $b_4(c_3 + c_1) +$ $b_2c_0 + c_3$ $(b_1 + b_2) +$ $c_0(b_3 + b_4) +$ $c_4(b_1 + b_3)$ | $b_1(c_0 + c_4)$ $b_0(c_4 + c_2) +$ $b_3c_1 + b_4$ $c_0(b_4 + b_2) +$ $c_0b_0$ |
| 9 | $b_1(c_0 + c_4)$ $b_0(c_4 + c_2) +$ $b_3c_1 +$ $b_4(c_3 + c_2) +$ $c_1(b_0 + b_4) +$ $c_0(b_4 + b_2) +$ $c_0b_0 +$ $c_3b_1$ | $b_1(c_0 + c_3) +$ $b_4c_2 + b_0$ $(c_4 + c_3) +$ $b_4(c_3 + c_2) +$ $c_1(b_0 + b_3) +$ $c_1b_1 + c_4$ $b_2 + c_0(b_3 + b_4)$ | $b_0c_3 +$ $b_1(c_0 + c_4) +$ $b_3(c_2 + c_1) +$ $b_2(c_1 + c_4) +$ $c_2b_2 +$ $c_0b_3 +$ $c_1(b_0 + b_4) +$ $c_3(b_1 + b_2)$ | $b_1c_4 +$ $b_2(c_1 + c_0) +$ $b_4(c_3 + c_2) +$ $b_3(c_2 + c_0) +$ $c_1b_4 +$ $c_2(b_1 + b_0) +$ $c_4(b_2 + b_3) +$ $c_3(b_0 + b_2)$ | $b_3(c_1 + c_2)$ $b_0(c_4 + c_3) +$ $b_4(c_3 + c_1) +$ $b_2c_0 + c_3$ $(b_1 + b_2) +$ $c_0(b_3 + b_4) +$ $c_4(b_1 + b_3) +$ $c_4b_4$ |
| 10 | $b_3(c_1 + c_2) +$ $b_0(c_4 + c_3) +$ $b_4(c_3 + c_1) +$ $b_2c_0 + c_3$ $(b_1 + b_2) +$ $c_0(b_3 + b_4) +$ $c_4(b_1 + b_3) +$ $c_4b_4$ | $b_1(c_0 + c_4)$ $b_0(c_4 + c_2) +$ $b_3c_1 +$ $b_4(c_3 + c_2) +$ $c_1(b_0 + b_4) +$ $c_0(b_4 + b_2) +$ $c_0b_0 +$ $c_3b_1$ $c_4(b_2 + b_3)$ | $b_1(c_0 + c_3) +$ $b_4c_2 + b_0$ $(c_4 + c_3) +$ $b_4(c_3 + c_2) +$ $c_1(b_0 + b_3) +$ $c_1b_1 + c_4$ $b_2 + c_0(b_3 + b_4)$ $c_2(b_0 + b_1)$ | $b_0c_3 +$ $b_1(c_0 + c_4) +$ $b_3(c_2 + c_1) +$ $b_2(c_1 + c_4) +$ $c_2b_2 +$ $c_0b_3 +$ $c_1(b_0 + b_4) +$ $c_3(b_1 + b_2) +$ $c_2(b_4 + b_1)$ | $b_1c_4 +$ $b_2(c_1 + c_0) +$ $b_4(c_3 + c_2) +$ $b_3(c_2 + c_0) +$ $c_1b_4 +$ $c_2(b_1 + b_0) +$ $c_4(b_2 + b_3) +$ $c_3(b_0 + b_2) +$ $c_3b_3$ |

TABLE 3

| m | m | m | m |
|---|---|---|---|
| 2-TYPE 1 | 3-TYPE 2 | 4-TYPE 1 | 5-TYPE 2 |
| 6-TYPE 2 | 9-TYPE 2 | 10-TYPE 1 | 11-TYPE 2 |
| 12-TYPE 1 | 14-TYPE 2 | 18-TYPE 1 | 23-TYPE 2 |
| 26-TYPE 2 | 28-TYPE 1 | 29-TYPE 2 | 30-TYPE 2 |
| 33-TYPE 2 | 35-TYPE 2 | 36-TYPE 1 | 39-TYPE 2 |
| 41-TYPE 2 | 50-TYPE 2 | 51-TYPE 2 | 52-TYPE 1 |
| 53-TYPE 2 | 58-TYPE 1 | 60-TYPE 1 | 65-TYPE 2 |
| 66-TYPE 1 | 69-TYPE 2 | 74-TYPE 2 | 81-TYPE 2 |
| 82-TYPE 1 | 83-TYPE 2 | 86-TYPE 2 | 89-TYPE 2 |
| 90-TYPE 2 | 95-TYPE 2 | 98-TYPE 2 | 99-TYPE 2 |
| 100-TYPE 1 | 105-TYPE 2 | 106-TYPE 1 | 113-TYPE 2 |
| 119-TYPE 2 | 130-TYPE 1 | 131-TYPE 2 | 134-TYPE 2 |
| 135-TYPE 2 | 138-TYPE 2 | 146-TYPE 2 | 148-TYPE 1 |
| 155-TYPE 2 | 158-TYPE 2 | 162-TYPE 1 | 172-TYPE 2 |
| 173-TYPE 2 | 174-TYPE 2 | 178-TYPE 1 | 179-TYPE 2 |
| 180-TYPE 1 | 183-TYPE 2 | 186-TYPE 2 | 189-TYPE 2 |
| 191-TYPE 2 | 194-TYPE 2 | 196-TYPE 2 | 209-TYPE 2 |
| 210-TYPE 1 | 221-TYPE 2 | 226-TYPE 1 | 230-TYPE 2 |
| 231-TYPE 2 | 233-TYPE 2 | 239-TYPE 2 | 243-TYPE 2 |
| 245-TYPE 2 | 251-TYPE 2 | 254-TYPE 2 | 261-TYPE 2 |
| 268-TYPE 1 | 270-TYPE 2 | 273-TYPE 2 | 278-TYPE 2 |
| 281-TYPE 2 | 292-TYPE 1 | 293-TYPE 2 | 299-TYPE 2 |
| 303-TYPE 2 | 306-TYPE 2 | 309-TYPE 2 | 316-TYPE 1 |
| 323-TYPE 2 | 326-TYPE 2 | 329-TYPE 2 | 330-TYPE 2 |
| 338-TYPE 2 | 346-TYPE 2 | 348-TYPE 1 | 350-TYPE 2 |
| 354-TYPE 2 | 359-TYPE 2 | 371-TYPE 2 | 372-TYPE 1 |
| 375-TYPE 2 | 378-TYPE 1 | 386-TYPE 2 | 388-TYPE 1 |
| 393-TYPE 2 | 398-TYPE 2 | 410-TYPE 2 | 411-TYPE 2 |
| 413-TYPE 2 | 414-TYPE 2 | 418-TYPE 1 | 419-TYPE 2 |
| 420-TYPE 1 | 426-TYPE 2 | 429-TYPE 2 | 431-TYPE 2 |
| 438-TYPE 2 | 441-TYPE 2 | 442-TYPE 1 | 443-TYPE 2 |
| 453-TYPE 2 | 460-TYPE 1 | 466-TYPE 1 | 470-TYPE 2 |
| 473-TYPE 2 | 483-TYPE 2 | 490-TYPE 1 | 491-TYPE 2 |
| 495-TYPE 2 | 508-TYPE 2 | 509-TYPE 2 | 515-TYPE 2 |
| 519-TYPE 2 | 522-TYPE 1 | 530-TYPE 2 | 531-TYPE 2 |
| 540-TYPE 1 | 543-TYPE 2 | 545-TYPE 2 | 546-TYPE 1 |
| 554-TYPE 2 | 556-TYPE 1 | 558-TYPE 2 | 561-TYPE 2 |
| 562-TYPE 1 | 575-TYPE 2 | 585-TYPE 2 | 586-TYPE 1 |
| 593-TYPE 2 | 606-TYPE 2 | 611-TYPE 2 | 612-TYPE 1 |

TABLE 3-continued

| m | m | m | m |
|---|---|---|---|
| 614-TYPE 2 | 615-TYPE 2 | 618-TYPE 1 | 629-TYPE 2 |
| 638-TYPE 2 | 639-TYPE 2 | 641-TYPE 2 | 645-TYPE 2 |
| 650-TYPE 2 | 651-TYPE 2 | 652-TYPE 1 | 653-TYPE 2 |
| 658-TYPE 1 | 659-TYPE 2 | 660-TYPE 1 | 676-TYPE 1 |
| 683-TYPE 2 | 686-TYPE 2 | 690-TYPE 2 | 700-TYPE 1 |
| 708-TYPE 1 | 713-TYPE 2 | 719-TYPE 2 | 723-TYPE 2 |
| 725-TYPE 2 | 726-TYPE 2 | 741-TYPE 2 | 743-TYPE 2 |
| 746-TYPE 2 | 749-TYPE 2 | 755-TYPE 2 | 756-TYPE 1 |
| 761-TYPE 2 | 765-TYPE 2 | 771-TYPE 2 | 772-TYPE 1 |
| 774-TYPE 2 | 779-TYPE 2 | 783-TYPE 2 | 785-TYPE 2 |
| 786-TYPE 1 | 791-TYPE 2 | 796-TYPE 1 | 803-TYPE 2 |
| 809-TYPE 2 | 810-TYPE 2 | 818-TYPE 2 | 820-TYPE 1 |
| 826-TYPE 1 | 828-TYPE 1 | 831-TYPE 2 | 833-TYPE 2 |
| 834-TYPE 2 | 846-TYPE 2 | 852-TYPE 1 | 858-TYPE 2 |
| 866-TYPE 2 | 870-TYPE 2 | 873-TYPE 2 | 876-TYPE 1 |
| 879-TYPE 2 | 882-TYPE 1 | 891-TYPE 2 | 893-TYPE 2 |
| 906-TYPE 1 | 911-TYPE 2 | 923-TYPE 2 | 930-TYPE 2 |
| 933-TYPE 2 | 935-TYPE 2 | 938-TYPE 2 | 939-TYPE 2 |
| 940-TYPE 1 | 946-TYPE 1 | 950-TYPE 2 | 953-TYPE 2 |
| 965-TYPE 2 | 974-TYPE 2 | 975-TYPE 2 | 986-TYPE 2 |
| 989-TYPE 2 | 993-TYPE 2 | 998-TYPE 2 | 1013-TYPE 2 |
| 1014-TYPE 2 | 1018-TYPE 1 | 1019-TYPE 2 | 1026-TYPE 2 |
| 1031-TYPE 2 | 1034-TYPE 2 | 1041-TYPE 2 | 1043-TYPE 2 |
| 1049-TYPE 2 | 1055-TYPE 2 | 1060-TYPE 1 | 1065-TYPE 2 |
| 1070-TYPE 2 | 1090-TYPE 1 | 1103-TYPE 2 | 1106-TYPE 2 |
| 1108-TYPE 1 | 1110-TYPE 2 | 1116-TYPE 1 | 1118-TYPE 2 |
| 1119-TYPE 2 | 1121-TYPE 2 | 1122-TYPE 1 | 1133-TYPE 2 |
| 1134-TYPE 2 | 1146-TYPE 2 | 1154-TYPE 2 | 1155-TYPE 2 |
| 1166-TYPE 2 | 1169-TYPE 2 | 1170-TYPE 1 | 1178-TYPE 2 |
| 1185-TYPE 2 | 1186-TYPE 1 | 1194-TYPE 2 | 1199-TYPE 2 |
| 1211-TYPE 2 | 1212-TYPE 1 | 1218-TYPE 2 | 1223-TYPE 2 |
| 1228-TYPE 1 | 1229-TYPE 2 | 1233-TYPE 2 | 1236-TYPE 1 |
| 1238-TYPE 2 | 1251-TYPE 2 | 1258-TYPE 1 | 1265-TYPE 2 |
| 1269-TYPE 2 | 1271-TYPE 2 | 1274-TYPE 2 | 1275-TYPE 2 |
| 1276-TYPE 1 | 1278-TYPE 2 | 1282-TYPE 1 | 1289-TYPE 2 |
| 1290-TYPE 1 | 1295-TYPE 2 | 1300-TYPE 1 | 1306-TYPE 1 |
| 1310-TYPE 2 | 1323-TYPE 2 | 1329-TYPE 2 | 1331-TYPE 2 |
| 1338-TYPE 2 | 1341-TYPE 2 | 1346-TYPE 2 | 1349-TYPE 2 |
| 1353-TYPE 2 | 1355-TYPE 2 | 1359-TYPE 2 | 1370-TYPE 2 |

TABLE 3-continued

| m | m | m | m |
|---|---|---|---|
| 1372-TYPE 1 | 1380-TYPE 1 | 1394-TYPE 2 | 1398-TYPE 2 |
| 1401-TYPE 2 | 1409-TYPE 2 | 1418-TYPE 2 | 1421-TYPE 2 |
| 1425-TYPE 2 | 1426-TYPE 1 | 1430-TYPE 2 | 1439-TYPE 2 |
| 1443-TYPE 2 | 1450-TYPE 1 | 1451-TYPE 2 | 1452-TYPE 1 |
| 1454-TYPE 2 | 1463-TYPE 2 | 1469-TYPE 2 | 1478-TYPE 2 |
| 1481-TYPE 2 | 1482-TYPE 1 | 1492-TYPE 1 | 1498-TYPE 1 |
| 1499-TYPE 2 | 1505-TYPE 2 | 1509-TYPE 2 | 1511-TYPE 2 |
| 1518-TYPE 2 | 1522-TYPE 1 | 1530-TYPE 1 | 1533-TYPE 2 |
| 1539-TYPE 2 | 1541-TYPE 2 | 1548-TYPE 1 | 1559-TYPE 2 |
| 1570-TYPE 1 | 1583-TYPE 2 | 1593-TYPE 2 | 1601-TYPE 2 |
| 1618-TYPE 1 | 1620-TYPE 1 | 1626-TYPE 2 | 1636-TYPE 1 |
| 1649-TYPE 2 | 1653-TYPE 2 | 1659-TYPE 2 | 1661-TYPE 2 |
| 1666-TYPE 1 | 1668-TYPE 1 | 1673-TYPE 2 | 1679-TYPE 2 |
| 1685-TYPE 2 | 1692-TYPE 1 | 1703-TYPE 2 | 1706-TYPE 2 |
| 1730-TYPE 2 | 1732-TYPE 1 | 1733-TYPE 2 | 1734-TYPE 2 |
| 1740-TYPE 1 | 1745-TYPE 2 | 1746-TYPE 1 | 1749-TYPE 2 |
| 1755-TYPE 2 | 1758-TYPE 2 | 1763-TYPE 2 | 1766-TYPE 2 |
| 1769-TYPE 2 | 1773-TYPE 2 | 1778-TYPE 2 | 1779-TYPE 2 |
| 1785-TYPE 2 | 1786-TYPE 1 | 1790-TYPE 2 | 1791-TYPE 2 |
| 1806-TYPE 2 | 1811-TYPE 2 | 1818-TYPE 2 | 1821-TYPE 2 |
| 1829-TYPE 2 | 1835-TYPE 2 | 1838-TYPE 2 | 1845-TYPE 2 |
| 1850-TYPE 2 | 1854-TYPE 2 | 1859-TYPE 2 | 1860-TYPE 1 |
| 1863-TYPE 2 | 1866-TYPE 1 | 1876-TYPE 1 | 1883-TYPE 2 |
| 1889-TYPE 2 | 1898-TYPE 2 | 1900-TYPE 1 | 1901-TYPE 2 |
| 1906-TYPE 1 | 1923-TYPE 2 | 1925-TYPE 2 | 1926-TYPE 2 |
| 1930-TYPE 1 | 1931-TYPE 2 | 1938-TYPE 2 | 1948-TYPE 1 |
| 1953-TYPE 2 | 1955-TYPE 2 | 1958-TYPE 2 | 1959-TYPE 2 |
| 1961-TYPE 2 | 1965-TYPE 2 | 1972-TYPE 1 | 1973-TYPE 2 |
| 1978-TYPE 1 | 1983-TYPE 2 | 1986-TYPE 1 | 1994-TYPE 2 |
| 1996-TYPE 1 | 2001-TYPE 2 | 2003-TYPE 2 | 2006-TYPE 2 |
| 2009-TYPE 2 | 2010-TYPE 2 | 2026-TYPE 1 | 2028-TYPE 1 |
| 2039-TYPE 2 | 2045-TYPE 2 | 2046-TYPE 2 | 2049-TYPE 2 |
| 2052-TYPE 1 | 2055-TYPE 2 | 2063-TYPE 2 | 2066-TYPE 2 |
| 2068-TYPE 2 | 2069-TYPE 2 | 2078-TYPE 2 | 2079-TYPE 2 |
| 2082-TYPE 1 | 2098-TYPE 1 | 2109-TYPE 2 | 2114-TYPE 2 |
| 2115-TYPE 2 | 2121-TYPE 2 | 2126-TYPE 2 | 2129-TYPE 2 |
| 2130-TYPE 1 | 2140-TYPE 1 | 2141-TYPE 2 | 2163-TYPE 2 |
| 2174-TYPE 2 | 2178-TYPE 2 | 2181-TYPE 2 | 2186-TYPE 2 |
| 2195-TYPE 2 | 2198-TYPE 2 | 2212-TYPE 1 | 2220-TYPE 1 |
| 2223-TYPE 2 | 2225-TYPE 2 | 2231-TYPE 2 | 2236-TYPE 1 |
| 2241-TYPE 2 | 2242-TYPE 1 | 2246-TYPE 2 | 2253-TYPE 2 |
| 2258-TYPE 2 | 2266-TYPE 2 | 2268-TYPE 1 | 2273-TYPE 2 |
| 2291-TYPE 2 | 2292-TYPE 1 | 2295-TYPE 2 | 2301-TYPE 2 |
| 2308-TYPE 1 | 2310-TYPE 2 | 2318-TYPE 2 | 2319-TYPE 2 |
| 2332-TYPE 1 | 2338-TYPE 1 | 2339-TYPE 2 | 2345-TYPE 2 |
| 2351-TYPE 2 | 2356-TYPE 1 | 2361-TYPE 2 | 2370-TYPE 1 |
| 2388-TYPE 1 | 2391-TYPE 2 | 2393-TYPE 2 | 2394-TYPE 2 |
| 2399-TYPE 2 | 2406-TYPE 2 | 2415-TYPE 2 | 2436-TYPE 1 |
| 2438-TYPE 2 | 2451-TYPE 2 | 2458-TYPE 1 | 2459-TYPE 2 |
| 2466-TYPE 1 | 2471-TYPE 2 | 2475-TYPE 2 | 2476-TYPE 1 |
| 2478-TYPE 2 | 2483-TYPE 2 | 2486-TYPE 2 | 2493-TYPE 2 |

APPENDIX I

May 24 02:50 1985  coeffs.c

```
include <stdio.h> define   MAXN      2560           /* maximum field degree */
define   MAXN32    80             /* array width */
#define   WORD      32             /* word size in bits */
#define   HEX8      (unsigned) 0X80000000    /* most sig bit in a word */
#define   HEX4      0X40000000     /* second most sig bit in a word */
#define   ONE       01             /* least sig bit (octal) */
define   ALLONE    0XFFFFFFFF     /* all ones vector */ int N;
int N32;
unsigned poly[MAXN32];

main(argc,argv)

int argc;
char *argv[];
{

/* ---------------------------------------------------------

Program to compute the coefficients b and c of
       an optimal multiply equation for digit d0 of
       product vector D = B * C where B,C, and D are
       the normal basis representations of elements in
       the Galois Field GF(2**m).

Source Language :        C  under UNIX O/S
       Author :                 Ivan M. Onyszchuk
       Date Last Modified :     May 24, 1985   2:04 am
       Modification :           Documentation added Execution :              <program name>  m  type
```

Result :  d0 multiply equation, 2m-1 pairs of
coefficients b and c. If an invalid
value of m or type is entered, an
error message is printed.

------------------------------------------------ */

```c
/*    variable declarations    */ unsigned *BP[MAXN];
unsigned *DP[MAXN];
unsigned *BI[MAXN];
unsigned mask;
int terms, out, out1, b;
int type;
unsigned *swap;
register int i;
register int j;
register int k;
register int l;
int t1, t2;
register unsigned *bp, **b1, **b2;
register unsigned *dp, *b3, *b4;
register unsigned temp, temp2;
unsigned beta1[MAXN32];
unsigned beta2[MAXN32];
unsigned one[MAXN32];
unsigned two[MAXN32];

/*    Read in value of m and type     */

N = atoi (argv[1]);
    type = atoi (argv[2]);
    N32 = (N - 1) / WORD + 1;

for (i = 0; i <= N32; i++)
        poly[i] = one[i] = two[i] = beta1[i] = 0;

/*    Compute generating polynomial     */ if (( type != 1 ) && ( type != 2))
        goto next;

if ( type == 2 ) {

*two = HEX8;
        *one = HEX8 | HEX4;

for(i=1; i<N; i++ ) {

*poly = *two ^ (*one >> 1);
            for (j=0; j < N32; j++)

poly[j] = two[j] ^ ((one[j-1] & ONE) ? (one[j] >>1 | HEX8)
                                (one[j] >> 1));

for (j=0; j < N32; j++)  {
                two[j] = one[j];
                one[j] = poly[j];
            }
        }
    } if ( type == 1 ) { for (j = 1; j < N32; j++)
            poly[j-1] = ALLONE;

poly[N32-1] = 0X80000000 >> ( N % WORD );
```

```c
        } for (i = 0; i < N; i++) {
            BP[i] = (unsigned *) calloc (N32, sizeof(unsigned));
            DP[i] = (unsigned *) calloc (N32, sizeof(unsigned));
            BI[i] = (unsigned *) calloc (N32, sizeof(unsigned));
        } for (i = 0; i < N32; i++) {
            *(beta1 + i) = 0;
            *(beta2 + i) = 0;
        }
        *beta1 = HEX4;

/*      Construct matrices for normal basis      */ for (i = 0, bp = *BP; i < N32; i++, bp++)
            *bp = *(beta1 + i);
        mult2 (beta1, beta1, *DP);

for (i = 1; i < N; i++) {
            mult2 (BP[i-1], BP[i-1], BP[i]);
            mult2 (BP[0], BP[i], DP[i]);
        } for (i = 0; i < N; i++) {
            for (j = 0; j < N32; j++)
                BI[i][j] = 0;
            BI[i][i/WORD] = HEX8 >> (i % WORD);
        }

/*      Gaussian elimination section      */ for (i = 0; i < N; i++) {
            if ((*(BP[i] + i / WORD) << i % WORD & HEX8) == 0)
                for (j = i + 1; j < N; j++)
                    if (*(BP[j] + i / WORD) << i % WORD & HEX8) {
                        swap = BP[i];
                        BP[i] = BP[j];
                        BP[j] = swap;
                        swap = BI[i];
                        BI[i] = BI[j];
                        BI[j] = swap;
                        break;
                    } if ((*(BP[i] + i / WORD) << i % WORD & HEX8) == 0) {
                printf(" Error - Matrix is not invertible! \n");
                goto next;
            } for (j = i + 1; j < N; j++)
                if (*(BP[j] + i / WORD) << i % WORD & HEX8) {
                    for (k = i / WORD; k < N32; k++)
                        *(BP[j] + k) ^= *(BP[i] + k);
                    for (k = 0; k < N32; k++)
                        *(BI[j] + k) ^= *(BI[i] + k);
                }
        } for (i = 0; i < N; i++)
            for (j = i - 1; j >= 0; j--)
                if (*(BP[j] + i / WORD) << i % WORD & HEX8) {
                    for (k = i / WORD; k < N32; k++)
                        *(BP[j] + k) ^= *(BP[i] + k);
                    for (k = 0; k < N32; k++)
                        *(BI[j] + k) ^= *(BI[i] + k);
```

```
                }

/*      Perform matrix transpose            */ for (i = 0, b1 = BI; i < N; i++, b1++)
            for (j = 0, b2 = BI; j < i; j++, b2++) {
                temp = ((*b1)[j/WORD] << (j % WORD)) & HEX8;
                temp >>= i % WORD;
                temp2 = ((*b2)[i/WORD] << (i % WORD)) & HEX8;
                temp2 >>= j % WORD;
                (*b1)[j/WORD] = ((*b1)[j/WORD] & ~(HEX8 >> j%WORD)) | temp2;
                (*b2)[i/WORD] = ((*b2)[i/WORD] & ~(HEX8 >> i%WORD)) | temp;
            } printf("\n  Product digit d0 multiply \n");
        printf("   equation coefficients \n\n");
        printf("         b            c \n\n");
        printf ("\n      %4d        %4d \n", N-1, N-1);

/*      Compute and print out b, c coefficients       */ for (i = 0, b1 = DP; i < N; i++, b1++) {
            for (j = 0, b2 = BI; j < i; j++, b2++) {
                out = 0;
                for (k = 0, b3 = *b1, b4 = *b2; k < N32; k++, b3++, b4++)
                    out ^= *b3 & *b4;
                out1 = 0;
                for (k = 0; k < WORD; k++, out >>= 1)
                    out1 ^= out & 1;

if (out1) {
                    t1 = (N - j) % N;
                    t2 = (N + i - j) % N;
                    printf ("      %4d        %4d \n", t1, t2);
                    printf ("      %4d        %4d \n", t2, t1);
                }
            }
        }
    next: ;
    }

/*  Element multiply subroutine     */ mult2(a,b,c)
unsigned *a, *b, *c;

{
        register int i;
        register int j;
        register unsigned *e;
        unsigned E[MAXN32];
        unsigned F[MAXN32];
        unsigned feed;

for (i = 0, e = E; i < N32; i++, e++, a++, b++, c++) {
            *e = *b;
            *(F + i) = *a;
            *c = 0;
        } for (i = 0; i < N; i++ ) {
            if (*(F + i/WORD) << i % WORD & HEX8)
                for (j = 0, c -= N32, e = E; j < N32; j++, c++, e++)
                    *c ^= *e;
            feed = *(e = E + (N-1)/ WORD) << ((N - 1) % WORD) & HEX8;
```

```
for (j = N32 - 1; j > 0; j--, e--)
    *e = ((*e >> 1)|((*(e-1) & ONE) << WORD-1))^( feed ? poly[j]:0)
*e = (*e >> 1) ^ ( feed ? *poly : 0);
}
}
```

We claim:

1. A method of determining the product D of two elements B and C of the finite field $GF(2^m)$, where m is an integer greater than 1, the field having elements $A^{2^i}$ ($0 \leq i < m$) that constitute a normal basis, comprising the steps of:

(a) representing the element B as a vector of binary digits $b_i$, where $b_i$ is the coefficient of $A^{2^i}$ in the normal basis representation of B, (b) representing the element C as a vector of binary digits $c_i$, where $c_i$ is the coefficient of $A^{2^i}$ in the normal basis representation of C, (c) representing the product D of elements B and C as a vector of binary digits $d_i$, where $d_i$ is the coefficient of $A^{2^i}$ in the normal basis representation of D, each of said binary digits $d_i$ being expressed in the form of a sum of products of the binary digits $b_j$ and $c_k$, ($0 \leq j, k < m$), (d) storing in m successive cells of a first recirculating shift register the binary digits, $b_i$, (e) storing in m successive cells of a second recirculating shift register the binary digits, $c_i$, (f) selecting at least some of said products of the binary digits $b_j$ and $c_k$ ($0 \leq j, k < m$) expressing a binary digit $d_i$ and grouping like ones of one of the binary digits $b_j$ or $c_k$ to provide grouped terms of the form $$b_j \left( \sum_{k=0}^{m-1} \sigma_{jk} c_k \right) \text{ or } c_k \left( \sum_{j=0}^{m-1} \sigma_{jk} b_j \right), \sigma_{jk} \in \{0,1\},$$
$$\text{mod } 2 \qquad \qquad \text{mod } 2$$

(g) associating each of said grouped terms with a different one of m accumulating cells of an accumulating recirculating shift register, (h) establishing connections between the cells of said first and second recirculating shift registers and a first of said accumulating cells to provide a first of said grouped terms in said accumulating cell, (i) establishing connections between the cells of said first and second recirculating shift registers and a second of said accumulating cells adjacent to said first of said accumulating cells to provide an expression equivalent to another of said grouped terms with the suffixes of the binary digits of said second grouped term increased by 1 (Modulo m), (j) repeating step i for successive ones of the grouped terms with the increase in the suffix of each binary digit of said grouped terms accumulating by 1 (Modulo m) for each repetition whereby there is provided in each accumulating cell a grouped term of each of the m binary digits $d_i$, (k) generating a respective grouped term in at least (m−1) of said accumulating cells, (l) accumulating modulo 2 each generated grouped term with the previously generated grouped terms accumulated in an adjacent one of said accumulating cells wherein grouped terms of the same binary digit are accumulated in the same cell, (m) transferring the contents of each cell of the first and second recirculating shift registers to its next cell, and (n) repeating steps k, l and m, (m−1) times whereby after (m−1) repetitions each of said accumulating cells contains the modulo 2 sum of said selected ones of the grouped terms of a different one of the binary digits $d_i$.

2. A method according to claim 1 comprising the steps of pairing said products such that one term of each pair has the form $b_j c_k$ and the other of each pair has the form $b_k c_j$, and selecting one of each pair together with any product terms that cannot be paired to form said grouped terms.

3. A method according to claim 2 wherein the other product terms of each pair are generated by interchanging the binary digits of said first and second recirculating shift registers upon completion of step n and repeating steps k through n.

4. A method according to claim 3 wherein each of said first and second shift recirculating registers are segmented into complementary segments and connections are established between said recirculating shift registers such that the contents of one of said segments of one recirculating shift register is interchanged with the contents of the corresponding segment of the other of said recirculating shift registers whereby the contents of the first and second recirculating shift registers are interchanged in less than m clock cycles.

5. A method according to claim 4 wherein the segments of each recirculating shift register are of equal size.

6. A method according to claim 3 wherein generation of product terms that cannot be paired is inhibited during one repetition of steps k to n.

7. A method according to claim 1 wherein all of the products are selected for grouping into grouped terms.

8. A method according to claim 1 wherein the establishment of connections includes the step of adding summed terms of each grouped term and subsequently multiplying the result thereof by the multiplier $b_j$ or $c_k$.

9. A method according to claim 1 including the step of storing the accumulated group terms in a latch.

10. A method of determining the product D of two elements B and C of the finite field $GF(2^m)$, where m is an integer greater than 1, the field having elements $A^{2^i}$ ($0 \leq i < m$) that constitute a normal basis, comprising the steps of:

(a) representing the element B as a vector of binary digits $b_i$, where $b_i$ is the coefficient of $A^{2^i}$ in the normal basis representation of B, (b) representing the element C as a vector of binary digits $c_i$, where $c_i$ is the coefficient of $A^{2^i}$ in the normal basis representation of C, (c) representing the product D of elements B and C as a vector of binary digits $d_i$, where $d_i$ is the coefficient of $A^{2^i}$ in the normal basis representation of D, each of said binary digits $d_i$ being expressed in the form of a sum of products of the binary digits $b_j$ and $c_k$, ($0 \leq j, k < m$), (d) storing in m successive cells of a first recirculating shift register the binary digits, $b_i$, (e) storing in m successive cells of a second recirculating shift register the binary digits, $c_i$,
(f) selecting at least some of said products of a binary digit $d_i$ and grouping like ones of one of the binary digits $b_j$ or $c_k$ to provide grouped terms of the form $$b_j \left( \sum_{k=0}^{m-1} \sigma_{jk} c_k \right) \text{ or } c_k \left( \sum_{j=0}^{m-1} \sigma_{jk} b_j \right), \sigma_{jk} \in \{0,1\},$$
$$\text{mod } 2 \qquad\qquad \text{mod } 2$$

(g) establishing connections from respective cells of said shift registers to each [+] cell of a recirculating accumulating shift register to produce in each accumulating cell a grouped term of a binary digit representing the vector D, said connections being established such that a first grouped term of one of said binary digits is accumulated in a first of said cells of said accumulating shift register and upon repeated transfer of the contents of said first accumulating cell through each of said accumulating cells accompanied by successive rotations of said recirculating shift register contents, successive grouped terms of said one binary digit will be generated and accumulated in successive accumulating cells,
(h) generating successive ones of said grouped terms of said one binary digit by rotating the vectors representing B and C in the first and second recirculating shift registers,
(i) accumulating modulo 2 said other grouped term with the previously generated grouped terms accumulated in an adjacent one of said accumulating cells to provide grouped terms of said one binary digit, and
(j) repeating the accumulation (m−1) times whereby grouped terms of each binary digit are accumulated simultaneously in successive accumulating cells to produce each of the m binary digits of the vector representing the product D simultaneously.

11. A method according to claim 10 wherein all of the products are selected for grouping into grouped terms.

12. A method according to claim 10 comprising the steps of pairing said products such that one term of each pair has the form $b_j c_k$ and the other of each pair has the form $b_k c_j$, and selecting one of each pair together with any pairs that cannot be paired to form said grouped terms.

13. A method according to claim 12 wherein the other product terms of each pair are generated by interchanging the binary digits of said first and second recirculating shift registers upon completion of step j and repeating steps h through j.

14. A method according to claim 13 wherein generation product terms that cannot be paired is inhibited during one repetition of steps h to j.

15. Apparatus for determining the product of two elements B and C of the finite field $GF(q^m)$, where m is an integer greater than 1, the field having elements $A^{q^i}$ ($0 \leq i < m$) that constitute a normal basis comprising:
(a) a first recirculating shift register having m successive cells each of which receives a q-ary digit $b_i$ of a vector representing the element B where $b_i$ is the coefficient of $A^{q^i}$ in the normal basis representation of B, (b) a second recirculating shift register having m successive cells each of which receives a q-ary digit $c_i$ of a vector representing the element C, where $c_i$ is the coefficient of $A^{q^i}$ in the normal basis representation of C,
(c) an accumulating recirculating shift register having m successive accumulating cells to accumulate successive grouped terms of each of the q-ary digits $d_i$ of a vector representing the product D of elements B and C, where $d_i$ is the coefficient of $A^{q^i}$ in the normal basis representation of D,
(d) logic means establishing connections from respective cells of said recirculating shift registers to each of said accumulating cells to produce in each accumulating cell a grouped term of a q-ary digit $d_i$ of a vector representing the product D, said connections being established such that a first grouped term of one of said q-ary digits is accumulated in a first of said accumulating cells and, upon repeated transfer of the contents of said first accumulating cell through each of said accumulating cells accompanied by successive rotations of said recirculating shift register contents, successive grouped terms of said one q-ary digit will be generated in successive cells,
(e) said accumulating cell having summing means to sum in GF(q) the output of said logic means and the previously generated grouped terms in an adjacent one of said accumulating cells, and thereby provide a further accumulation of grouped terms,
(f) means to store said further grouped terms, and
(g) means to rotate the contents of said recirculating shift registers through successive cells, whereby after m operations of said summing means each of said store means contains a q-ary digit $d_i$ of the vector representing the product D.

16. Apparatus according to claim 15 wherein said logic means establishes connections to generate grouped terms formed be selecting one of each pair of product terms having the form $b_j c_k$; $b_k c_j$ together with any product terms that cannot be paired.

17. Apparatus according to claim 16 including means to interchange the contents of the first and second recirculating shift registers after m successive rotations.

18. Apparatus according to claim 17 including means to inhibit selectively the logic means associated with one of said accumulating cells.

19. Apparatus according to claim 18 wherein said first and second circulating shift registers are segmented and said interchange means is operative to interchange the contents of corresponding segments of said first and second recirculating registers in less than m clock cycles.

20. Apparatus according to claim 15 wherein said logic means includes adding means to add (modulo q) the contents of respective cells of one of said shift recirculating registers, and
multiplier means to multiply in GF(q) the output of said adding means by the contents of one of the cells of the other of said recirculating shift registers.

21. Apparatus according to claim 20 wherein said store means comprises a memory element having an input connected to said summing means and an output connected to an adjacent one of said accumulating cells.

22. An apparatus according to claim 15 wherein q is equal to 2.

23. A method of determining the product D of two elements B and C the finite field $GF(q^m)$, where m is an integer greater than 1, the field having elements $a^{q^i}$ ($0 \leq i < m$) that constitute a normal basis, comprising the steps of:

(a) representing the element B as a vector of q-ary digits $b_i$, where $b_i$ is the coefficient of $A^{q^i}$ in the normal basis representation of B, (b) representing the element C as a vector of q-ary digits $c_i$, where $c_i$ is the coefficient of $A^{q^i}$ in the normal basis representation of C, (c) representing the product D of elements B and C as a vector of q-ary digits $d_i$, where $d_i$ is the coefficient of $A^{q^i}$ in the normal basis representation of D, each of said q-ary digits $d_i$ being expressed in the form of a sum of products of the q-ary digits $b_j$ and $c_k$, ($0 \leq j,k < m$), (d) storing in m successive cells of a first recirculating shift register the q-ary digits, $b_i$, (e) storing in m successive cells of a second recirculating shift register the q-ary digits, $c_i$, (f) selecting at least some of said products of the q-ary digits $b_j$ and $c_k$ ($0 \leq j,k < m$) expressing a q-ary digit $d_i$ and grouping like ones of one of the q-ary digits $b_j$ or $c_k$ to provide grouped terms of the form $$b_j \left( \sum_{k=0}^{m-1} \sigma_{jk} c_k \right) \text{ or } c_k \left( \sum_{j=0}^{m-1} \sigma_{jk} b_j \right), \quad \sigma_{jk} \in GF(q),$$
$$GF(q) \qquad\qquad GF(q)$$

(g) associating each of said grouped terms with a different one of m accumulating cells of an accumulating recirculating shift register, (h) establishing connections between the cells of said first and second recirculating shift registers and a first of said accumulating cells to provide a first of said grouped terms in said accumulating cell, (i) establishing connections between the cells of said first and second recirculating shift registers and a second of said accumulating cells adjacent to said first of said accumulating cells to provide an expression equivalent to another of said grouped terms with the suffixes of the q-ary digits of said second grouped term increased by 1 (Modulo m), (j) repeating step i for successive ones of the grouped terms with the increase in the suffix of each q-ary digit of said grouped terms accumulating by 1 (Modulo m) for each repetition whereby there is provided in each accumulating cell a grouped term of each of the m q-ary digits $d_i$, (k) generating a respective grouped term in at least (m−1) of said accumulating cells, and (l) accumulating in GF(q) the generated grouped term with the previously generated grouped terms accumulated in an adjacent one of said accumulating cells wherein grouped terms of the same q-ary digit are accumulated in the same cell, (m) transferring contents of each cell of the first and second recirculating shift registers to its next cell, (n) repeating steps k, l and m, (m−1) times whereby, after (m−1) repetitions, each of said accumulating cells contains said selected ones of the grouped terms of a different one of the q-ary digits $d_i$.

24. A method according to claim 22 comprising the steps of pairing said products such that one term of each pair has the form $b_j c_k$ and the other of each pair has the form $b_k c_j$, and selecting one of each pair together with any product terms that cannot be paired to form said grouped terms.

25. A method according to claim 24 wherein q is equal to 2.

26. A method according to claim 23 wherein all of the products are selected for grouping into grouped terms.

27. A method according to claim 26 wherein q is equal to 2.

* * * * *